(12) United States Patent
Chang et al.

(10) Patent No.: US 6,686,129 B2
(45) Date of Patent: Feb. 3, 2004

(54) PARTIAL PHOTORESIST ETCHING (75) Inventors: Ming-Ching Chang, Taipei (TW); Hun-Jan Tao, Hsinchu (TW)

(73) Assignee: Taiwan Semiconductor Manufacturing Co. Ltd., Hsin Chu (TW)

( * ) Notice: Subject to any disclaimer, the term of this patent is extended or adjusted under 35 U.S.C. 154(b) by 59 days.

(21) Appl. No.: 09/975,854

(22) Filed: Oct. 11, 2001

(65) Prior Publication Data
US 2003/0073041 A1 Apr. 17, 2003

(51) Int. Cl.⁷ .................................................. G03F 7/26
(52) U.S. Cl. .......................................... 430/313; 216/41
(58) Field of Search ................................. 430/311, 313, 430/316, 317; 216/41

(56) References Cited

U.S. PATENT DOCUMENTS 6,283,131 B1 * 9/2001 Chen .......................... 134/1.2
6,534,414 B1 * 3/2003 Wang ......................... 438/709

* cited by examiner

Primary Examiner—Kathleen Duda
(74) Attorney, Agent, or Firm—Tung & Associates

(57) ABSTRACT

Partial photoresist etching is disclosed. A film on a semiconductor wafer includes a hard mask, doped polysilicon below the hard mask, undoped polysilicon below the doped polysilicon, and a stop layer below the undoped polysilicon. Photoresist etching is performed through the hard mask and the doped polysilicon by using a photoresist mask. After the photoresist mask is removed, photoresist-free etching is performed through the undoped polysilicon through to the stop layer by using the hard mask. A semiconductor device is disclosed that may be fabricated using this partial photoresist etching process.

14 Claims, 10 Drawing Sheets

PARTIAL PHOTORESIST ETCHING

FIELD OF THE INVENTION

This invention relates generally to the etching process used in semiconductor manufacture, and more particularly to an inventive partial photoresist etching process.

BACKGROUND OF THE INVENTION

Patterning is one of the basic steps performed in semiconductor processing. Patterning is also referred to as photolithography, masking, oxide or metal removal, and microlithography. Patterning enables the selective removal of material deposited on a semiconductor substrate, or wafer, as a result of deposition. The process of depositing layers and removing selective parts of them, in conjunction with other processes, permits the fabrication of semiconductor devices.

Patterning can be a dry etching or a wet etching process. Wet etching refers to the use of wet chemical processing to selectively remove the material from the wafer. The chemicals are placed on the surface of the wafer, or the wafer itself is submerged in the chemicals. Dry etching refers to the use of plasma stripping, using a gas such as oxygen ($O_2$), $C_2F_6$ and $O_2$, or another gas. Whereas wet etching is a low-temperature process, dry etching is typically a high-temperature process.

Figure 1A:
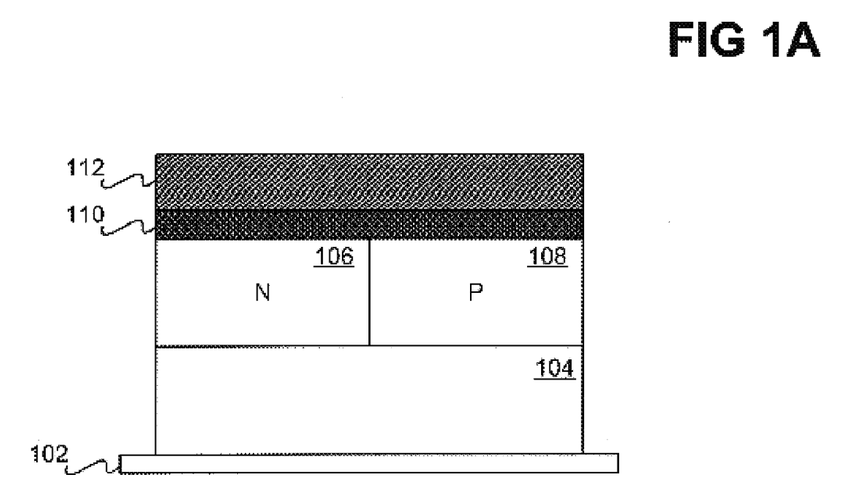
FIGS. 1A–1E are diagrams showing a conventional photoresist dry etching process.

One common type of dry etching uses photoresist, which is described in conjunction with FIGS. 1A–1E. In FIG. 1A, a stop layer 102 is initially deposited. The stop layer 102 may be a type of oxide, and prevents the etchant from removing material beyond the stop layer 102. Next, there is a layer of polysilicon 104, which is specifically not doped, and of which an –type region 106 and a P+ type region 108 have been specifically doped. There is also a hard mask 110. The hard mask 110 may be silicon dioxide, silicon nitride, an inorganic anti-reflective coating, or another type of mask. Finally, there is a layer of photoresist 112.

Figure 1B:
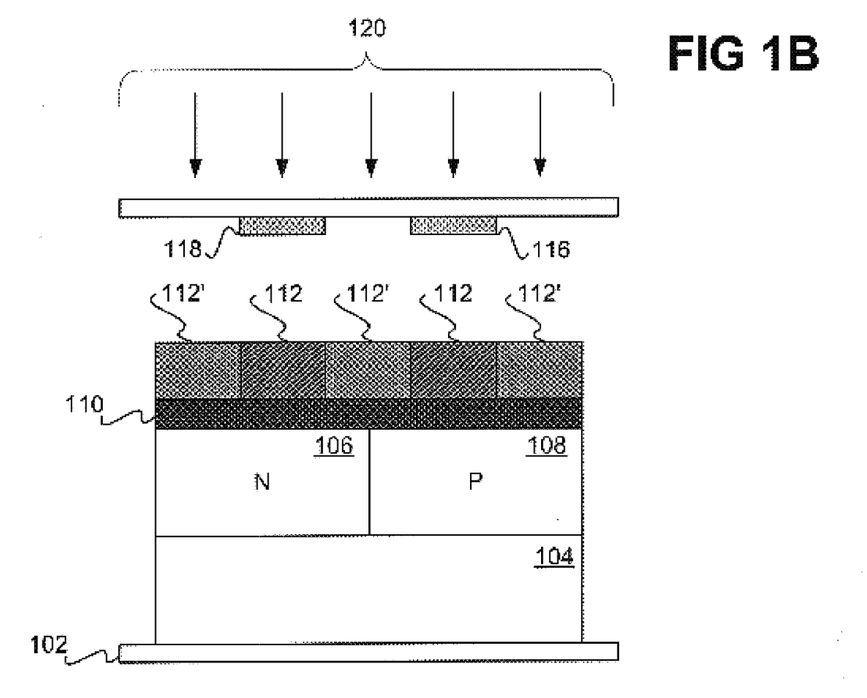

In FIG. 1B, a mask 114 is placed over the photoresist 112. The mask 114 includes dark regions 116 and 118. Ultraviolet rays 120 are then applied, which develops, or exposes, those parts of the photoresist 112 not directly underneath the dark regions 116 and 118, which are indicated as the photoresist 112'. The unexposed photoresist 112 is unpolymerized, whereas the exposed photoresist 112' is polymerized.

Figure 1C:
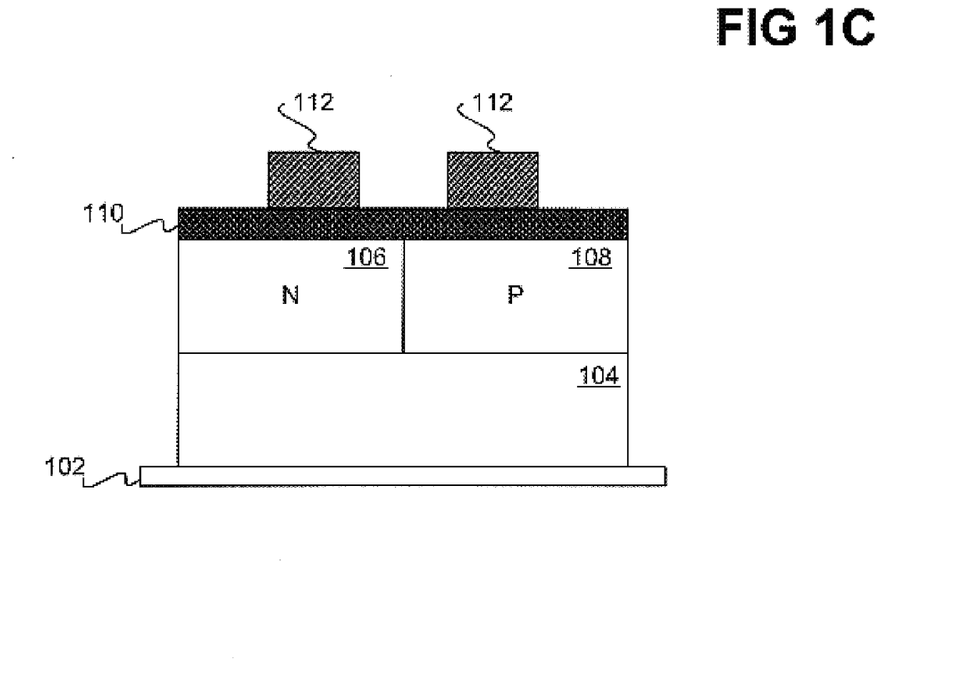

In FIG. 1C, the photoresist 112' that was polymerized as a result of exposure to the ultraviolet rays 120 is developed, or removed. The only remaining photoresist is the unpolymerized photoresist 112 beneath the dark regions 116 and 118. Thus, the remaining photoresist 112 has a pattern corresponding to the dark regions 116 and 118 of the mask 114.

Figure 1D:
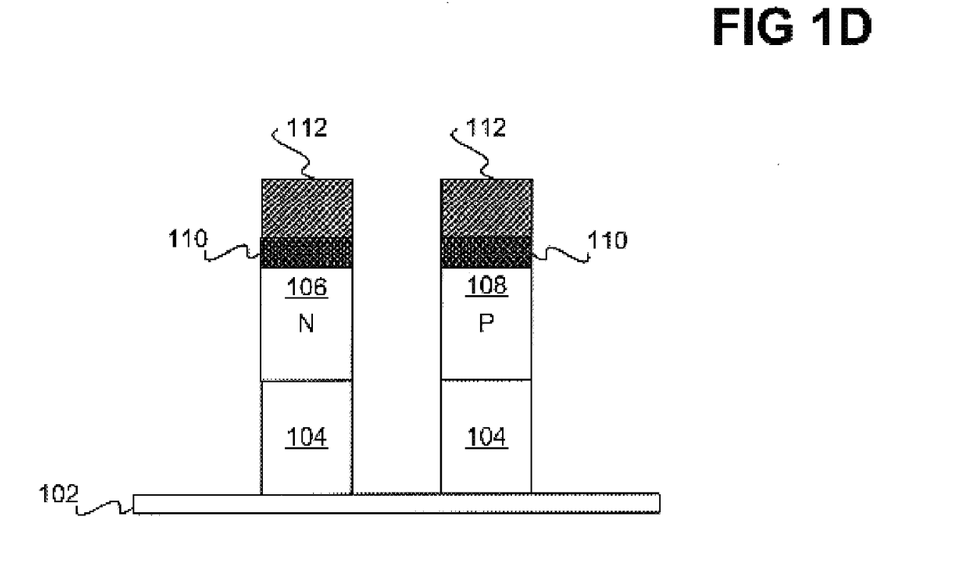

In FIG. 1D, the mask 114, the –type region 106, the P+ type region 108, and the polysilicon 104 are etched. The only parts of the mask 114, the regions 106 and 108, and the polysilicon 104 that remain are those underneath the remaining photoresist 112. Finally, in FIG. 1E, the remaining, unpolymerized photoresist 112 is stripped, resulting in an –type stack 122, and a P+ type stack 124.

Figure 2A:
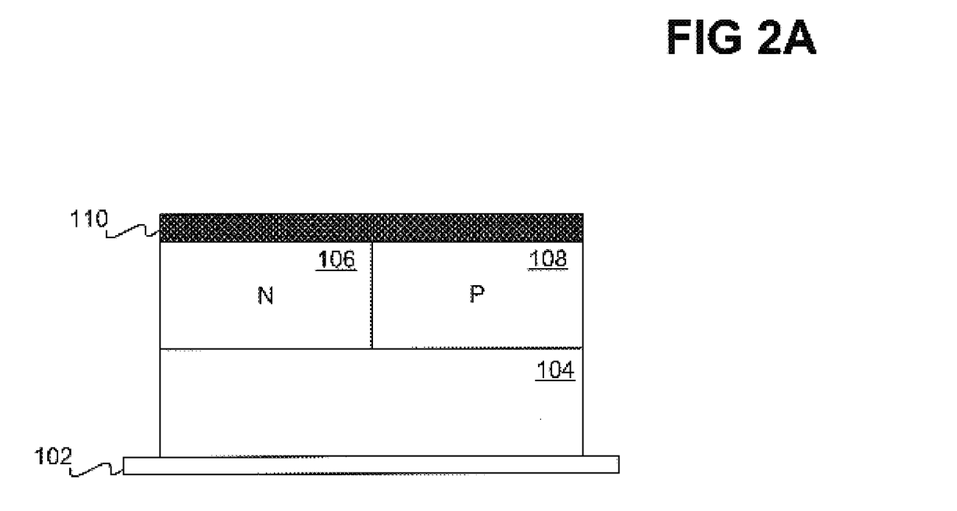
FIGS. 2A–2D are diagrams showing a conventional photoresist-free dry etching process.
Figure 2B:
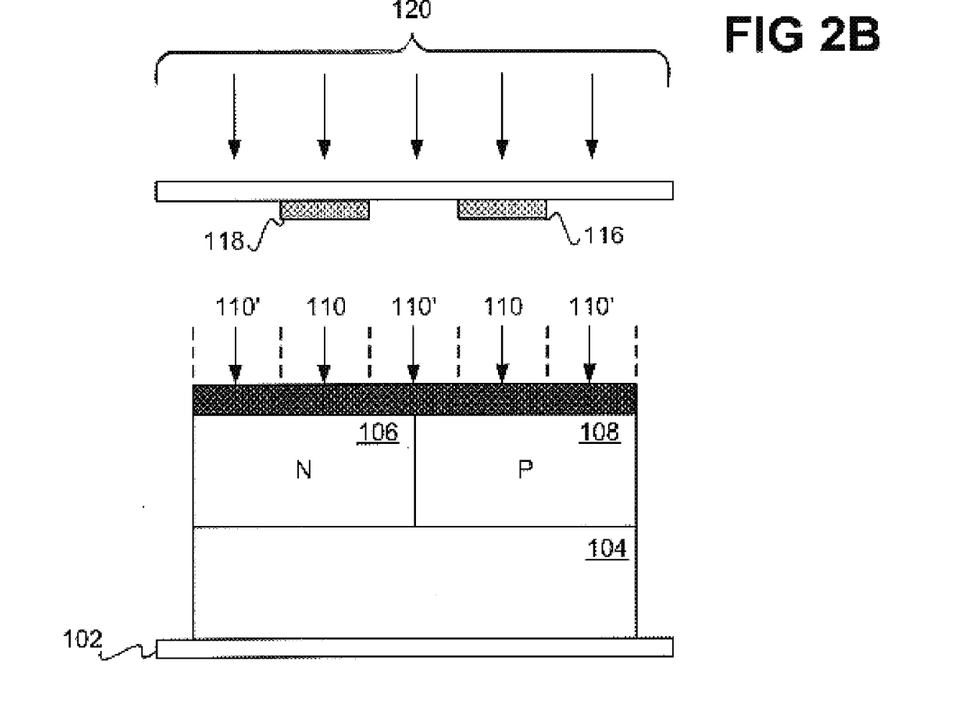

Another type of dry etching does not use photoresist. This photoresist-free etching instead uses the hard mask itself for the patterning of the underlying polysilicon. This type of etching is described in conjunction with FIGS. 2A–2D. In FIG. 2A, a stop layer 102 is initially deposited. Next, there is a layer of polysilicon 104, which is specifically not doped, and of which an –type region 106 and a P+ region 108 have been specifically doped. Finally, there is a hard mask 110. In FIG. 2B, a mask 114 is placed over the hard mask 110. The mask 114 includes dark regions 116 and 118. Ultraviolet rays 120 are then applied, which develops, or exposes, those parts of the hard mask 110 that are not directly underneath the dark regions 116 and 118, and that are indicated as the hard mask 110'.

Figure 2C:
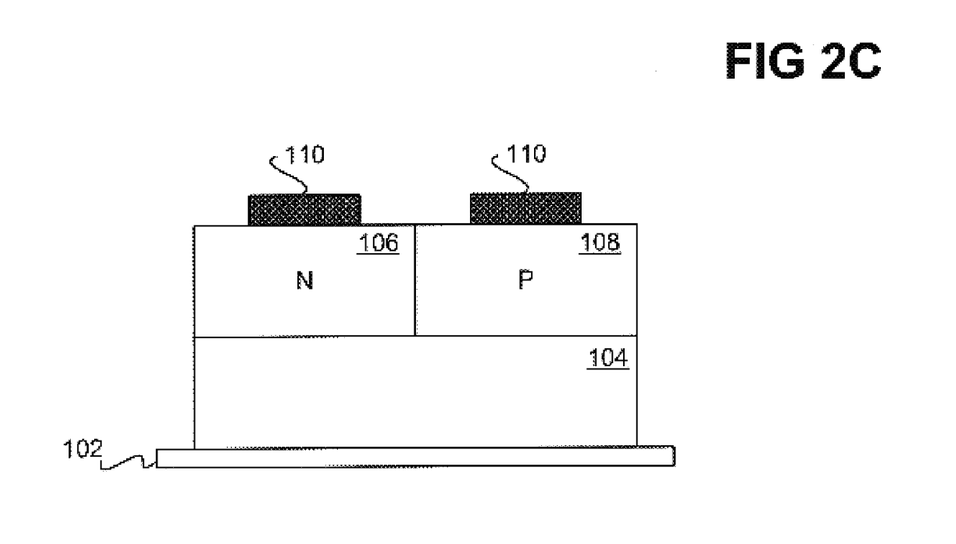
Figure 2D:
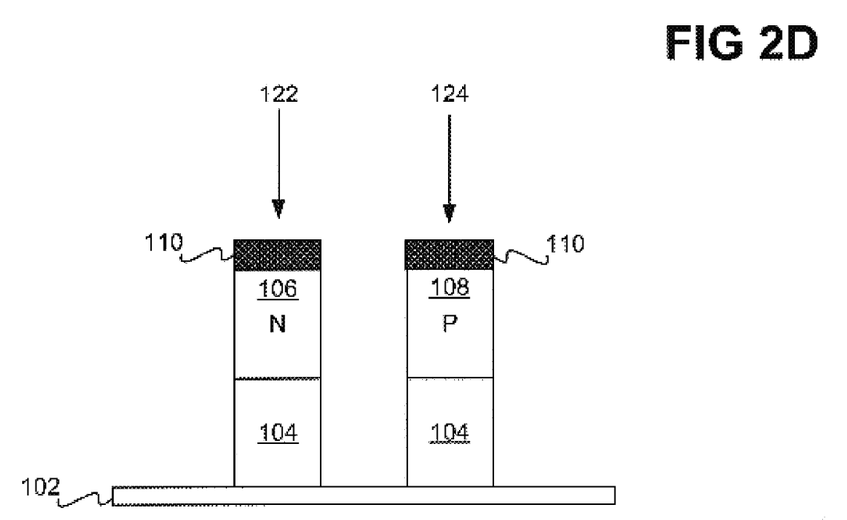

In FIG. 2C, the hard mask 110' that was exposed to the ultraviolet rays 120 is removed. The only remaining hard mask 110 is that which was beneath the dark regions 116 and 118. Therefore, the remaining hard mask 110 has a pattern corresponding to the dark regions 116 and 118 of the mask 114. In FIG. 2D, the N-type region 106, the P+ region 108, and the polysilicon 104 are etched. The only parts of the regions 106 and 108 and the polysilicon 104 that remain are those underneath the remaining hard mask 114. Thus, there is an –type stack 122 and a P+ type stack 124.

Figure 1E:
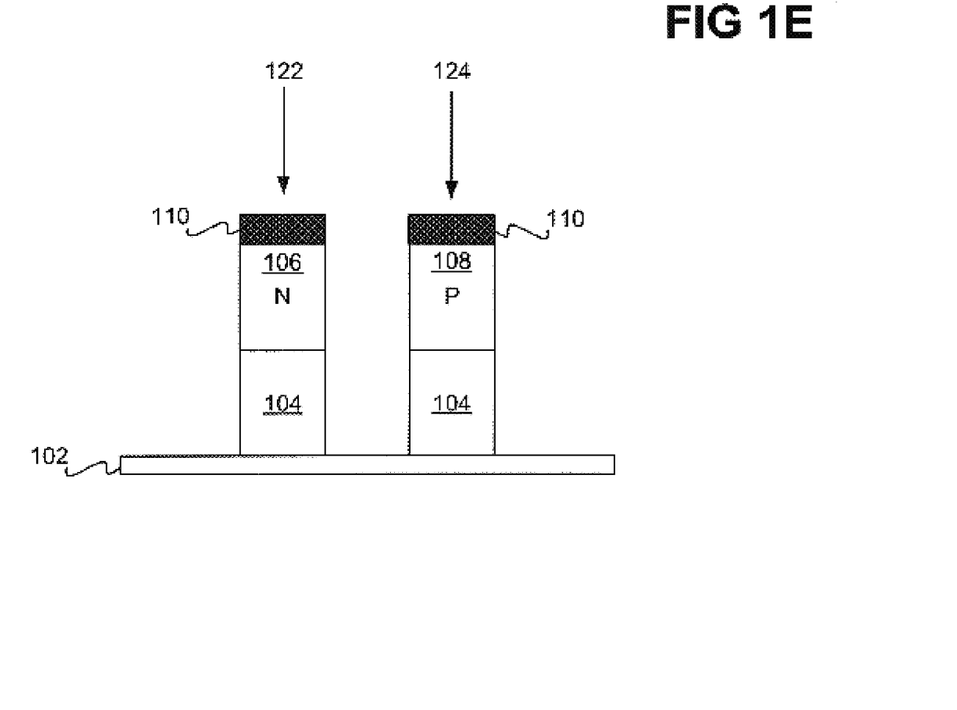

The result of the photoresist-free dry etching process shown in FIG. 2D is therefore theoretically identical to the result of the photoresist dry etching process shown in FIG. 1E. However, each of these processes has advantages and disadvantages. The photoresist of the photoresist process acts as a passivation surface, which helps to ensure the proper shaping of the profiles of the stacks 122 and 124. That is, the passivation functionality of the photoresist ensures that the vertical surfaces of the stacks 122 and 124 are substantially perpendicular to the horizontal surface of the stop layer 102.

Disadvantageously, however, the photoresist process poorly controls the critical dimensions of the semiconductor device being fabricated. The critical dimensions of the device are the widths of the lines and the spaces of critical circuit patterns of the device. In particular, the photoresist process frequently exhibits a proximity effect that can narrow the desired widths of the stacks 122 and 124.

Figure 3:
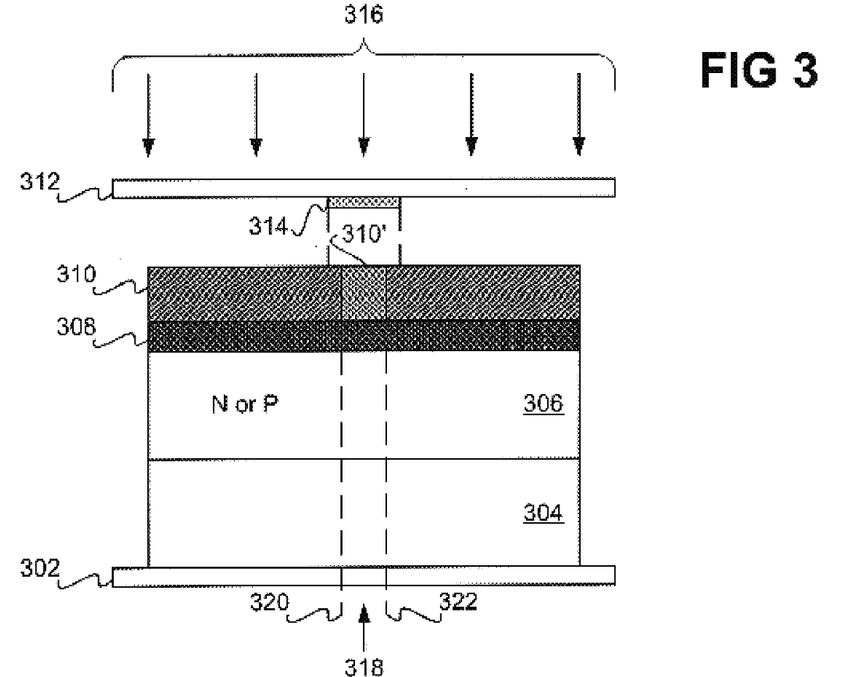
FIG. 3 is a diagram showing the proximity effect that can lessen critical dimension control of the conventional photoresist process of FIGS. 1A–1E.

The proximity effect is shown in FIG. 3. The mask 312 positioned over the photoresist 310 has a dark region 314 of a given width, such that ideally the width of the unpolymerized photoresist 310' is identical after exposure to the ultraviolet rays 316. However, because of the proximity effect, the width of the unpolymerized photoresist 310' is in fact less than the width of the polymerized photoresist 310. The stack of polysilicon 304, doped polysilicon 306, and hard mask 308 on top of the stop layer 302 that will result, as indicated by the arrow 318 between the dotted lines 320 and 322, will not identically correspond to the dark region 314. That is, the width of the stack will be less than the width of the dark region 314. Where the stack is a critical pattern of the device, this means that the photoresist dry etching process poorly controls the critical dimensions of the device.

Figure 4:
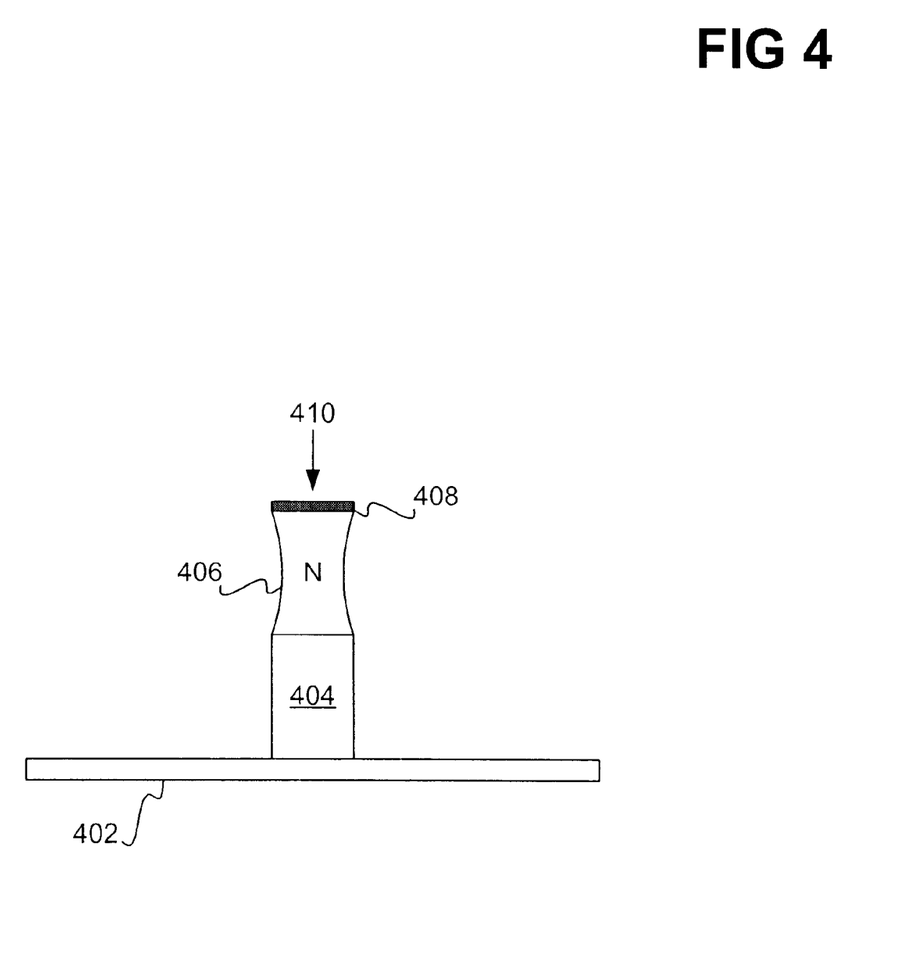
FIG. 4 is a diagram showing the poor profile shaping of the conventional photoresist-free dry etching process of FIGS. 2A–2D.

By comparison, the photoresist-free dry etching process provides for good control of the critical dimensions of the device being fabricated. However, the lack of photoresist in the photoresist-free process disadvantageously means that no passivation surface is present to help ensure the proper shaping of the profiles of the stacks 122 and 124. Necking of the doped regions 106 and/or 108 may result. Necking is shown in FIG. 4. On top of the stop layer 402 are polysilicon 404, an –type region 406, and a hard mask 408 forming a stack 410. The N-type region 406 of the stack 410 has an hourglass shape, resulting from the etching of this region 406 and the polysilicon 404 underneath the hard mask 408. The hourglass shape results during etching because there is no passivation surface to ensure the proper shaping of the profile of the stack 410.

Therefore, there is a need for a dry etching process that avoids the disadvantages of the photoresist process and the photoresist-free process, while maintaining the advantages of both processes. There is a need for a new etching process that provides for good critical dimension control, desirably by limiting the proximity effect. There is a need for a new etching process that also provides for proper profile shaping, such as that which results resulting from using a passivation surface. For these and other reasons, there is a need for the present invention.

SUMMARY OF THE INVENTION

The invention relates to partial photoresist etching. A film on a semiconductor wafer includes a hard mask, doped polysilicon below the hard mask, undoped polysilicon below the doped polysilicon, and a stop layer below the undoped polysilicon. Photoresist etching is performed through the hard mask and the doped polysilicon, but not through the undoped polysilicon, by using a photoresist mask. The photoresist mask imparts a pattern through the hard mask and the doped polysilicon. After the photoresist mask is removed, photoresist-free etching is performed through the undoped polysilicon through to the stop layer. The photoresist-free etching uses the hard mask, which imparts the pattern through the undoped polysilicon. A semiconductor device may be fabricated using this partial photoresist etching process. Such a semiconductor device may include a hard mask and doped polysilicon that were photoresist etched, and undoped polysilicon that was photoresist-free etched.

The invention provides for advantages not found in the photoresist and photoresist-free etching processes of the prior art. In particular, the inventive partial photoresist process avoids the disadvantages of the photoresist and photoresist-free processes, while maintaining their advantages. The partial photoresist process maintains the proper profile shaping of the photoresist process, while avoiding the poor profile shaping of the photoresist-free process. Likewise, the partial photoresist process maintains the good critical dimension control of the photoresist-free process, while avoiding the proximity effect of the photoresist process that results in poor critical dimension control. Still other advantages, embodiments, and aspects of the invention will become apparent by reading the detailed description that follows, and by referencing the attached drawings.

DETAILED DESCRIPTION OF THE INVENTION

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

Figure 5:
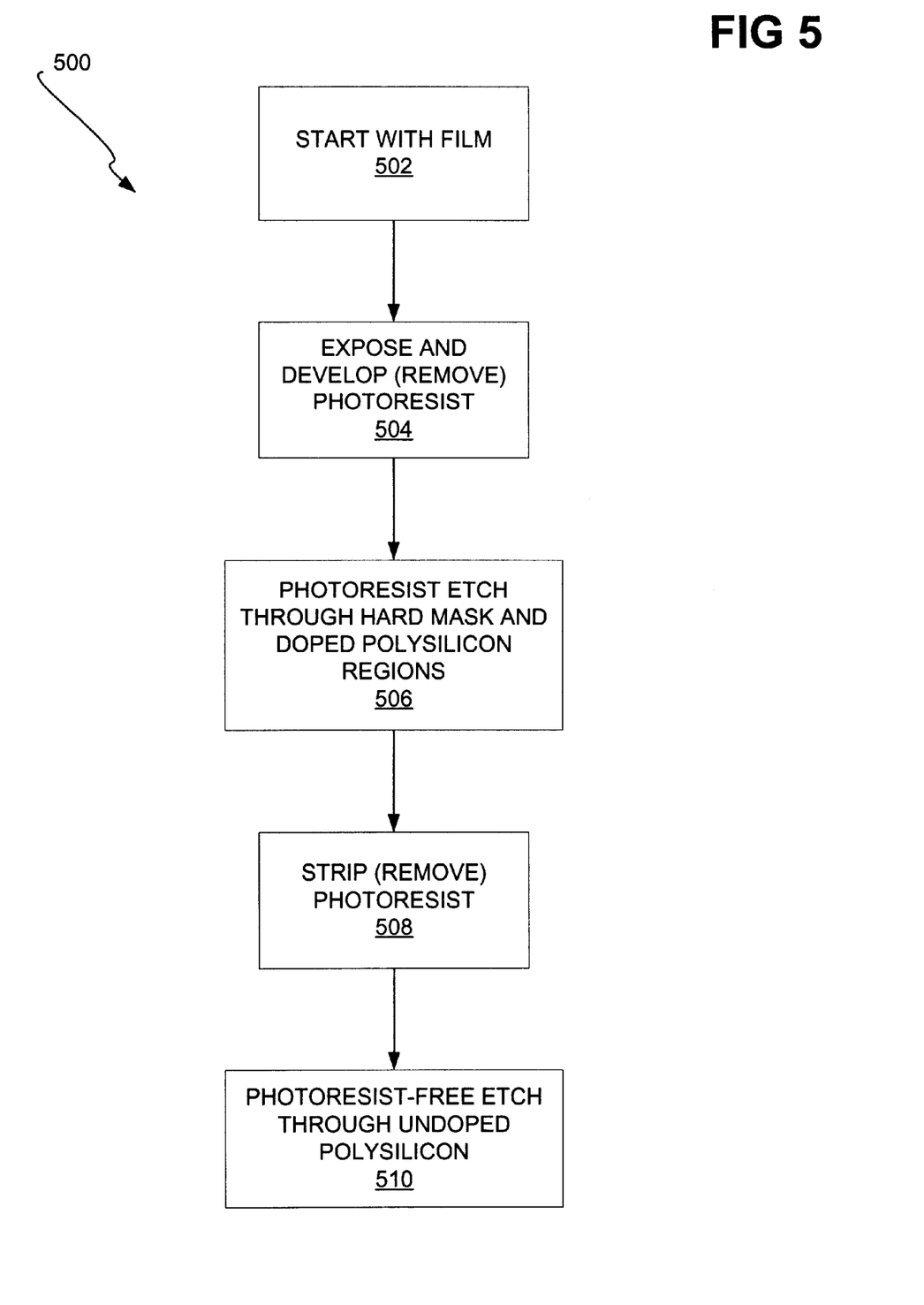
FIG. 5 is a flowchart of a partial photoresist etching process, according to one embodiment of the invention.
Figure 6A:
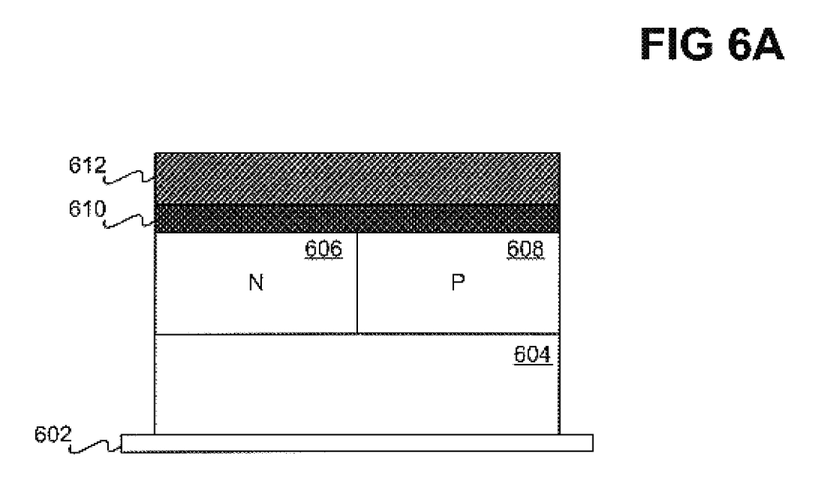
FIGS. 6A–6F are diagrams showing the partial photoresist etching process of FIG. 5, according to one embodiment of the invention.

FIG. 5 shows a method 500 of a partial photoresist dry etching process according to an embodiment of the invention. The process starts with a film of deposited layers (502). An example of this film is shown in FIG. 6A. The stop layer 602 may be a type of oxide, and prevents etchant from removing layers beyond the stop layer 602. The polysilicon 604 is not doped. However, polysilicon regions 606 and 608 have been doped. The region 606 has been doped as an –type region, whereas the region 608 has been doped as a P+ type region. The doped regions 606 and 608 may be annealed after doping, but this is optional. The hard mask 610 may be silicon dioxide, silicon nitride, an organic anti-reflective coating, or another type of mask. Finally, there is a layer of photoresist 612.

Figure 6B:
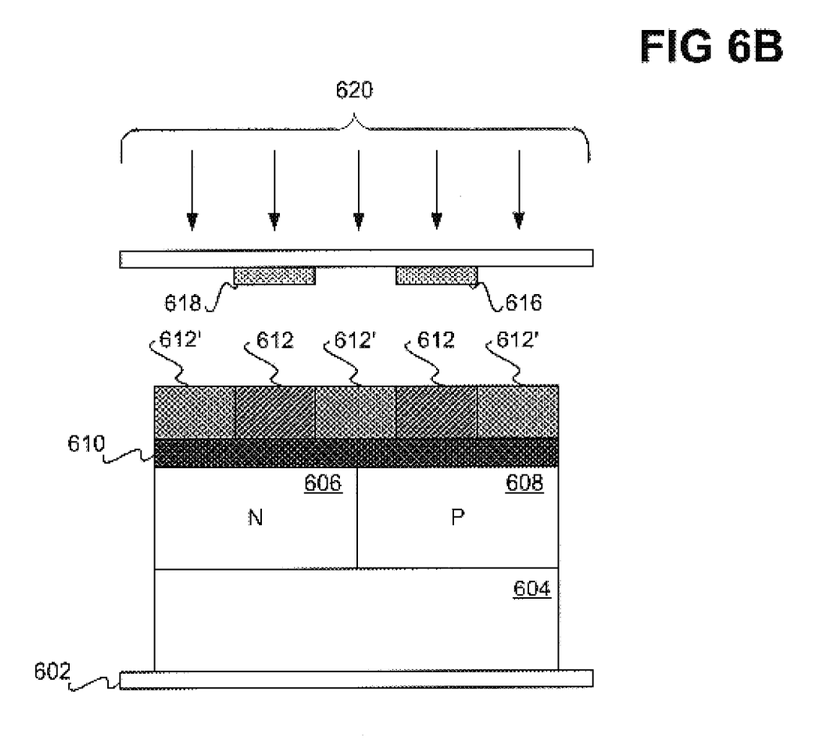
Figure 6C:
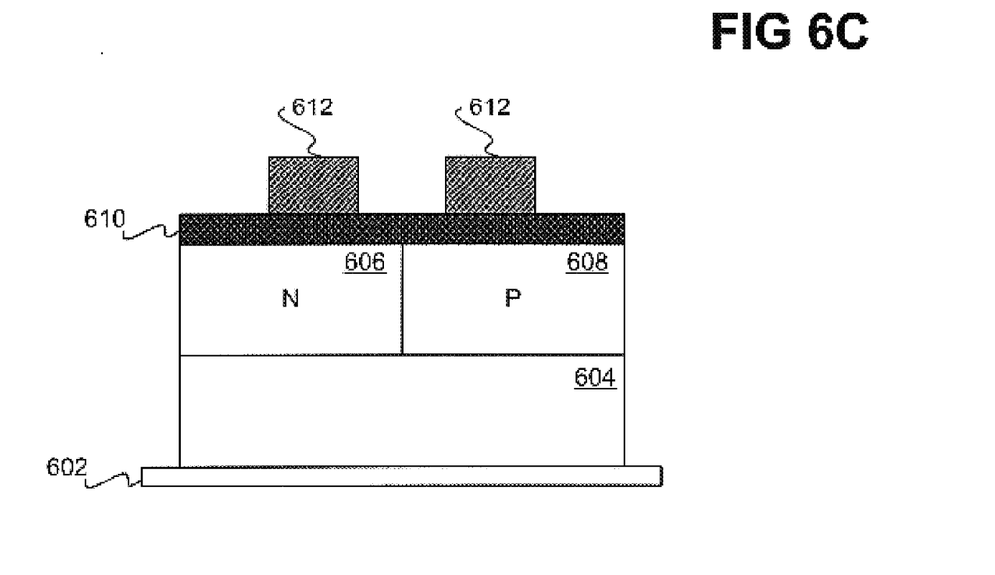

Referring back to FIG. 5, the photoresist is exposed and developed, or removed (504). An example of exposure and developing is shown in FIGS. 6B and 6C, respectively. In FIG. 6B, a mask 614 that has dark regions 616 and 618 is placed over the photoresist 612. Ultraviolet rays 120 are applied to develop, or expose, parts of the photoresist 612 not directly underneath the dark regions 616 and 618, which are indicated as the photoresist 612'. The unexposed photoresist 612 is unpolymerized, whereas the exposed photoresist 612' is polymerized. In FIG. 6C, the polymerized photoresist 612' is developed, or removed. The only remaining photoresist is the unpolymerized photoresist 612 beneath the dark regions 616 and 618, having a pattern corresponding to the regions 616 and 618.

Figure 6D:
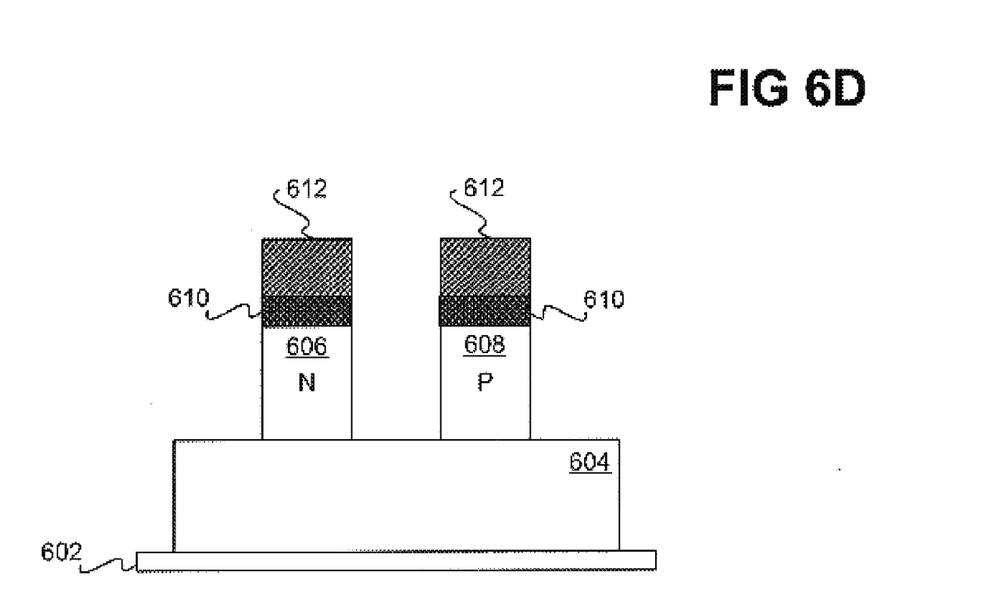

Referring back to FIG. 5, photoresist etching is performed through the hard mask 610 and the doped regions 606 and 608, but not through the polysilicon 604 (506). An example of photoresist etching is shown in FIG. 6D. The only parts of the hard mask 610 and the doped regions 606 and 608 that remain are those underneath the remaining photoresist 612, such that the hard mask 610 and the doped regions 606 and 608 correspond to the pattern of the photoresist 612. The polysilicon 604, however, is not etched.

Figure 6E:
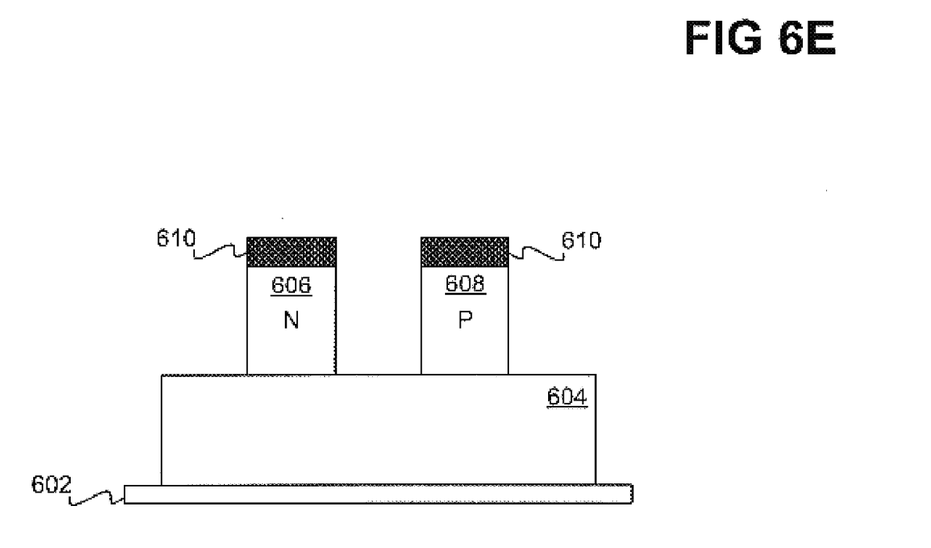
Figure 6F:
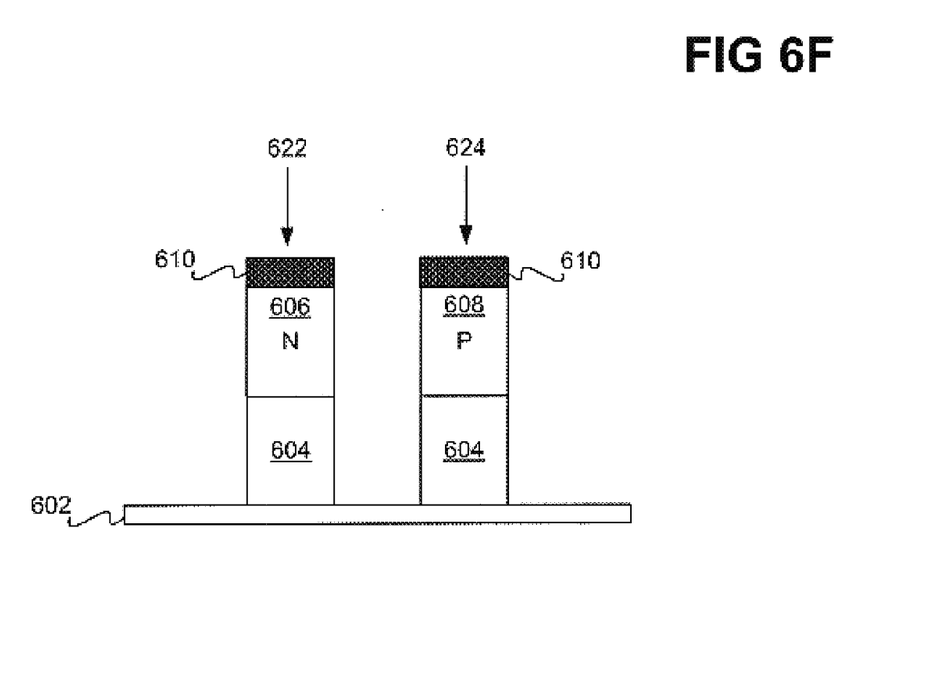

Referring back to FIG. 5, the remaining photoresist 612 is stripped, or removed (508). An example of photoresist stripping is shown in FIG. 6E. The photoresist 612 has been removed from the hard mask 610. Referring back to FIG. 5, photoresist-free etching is performed through the undoped polysilicon 604 to the stop layer 602 (510), such that the undoped polysilicon corresponds to the pattern of the hard mask 610 and the doped regions 606 and 608. An example of photoresist-free etching is shown in FIG. 6F. Two stacks result, an N-type stack 622, and a P+ stack 624.

The method 500 of FIG. 5 as depicted in FIGS. 6A–6F is a partial photoresist dry etching process because photoresist etching is used only to etch through the hard mask 610 and the doped polysilicon regions 606 and 608, but not through the undoped polysilicon 604. Rather, photoresist-free etching is used to etch through the undoped polysilicon 604. The resulting semiconductor device, such as that shown in FIG. 6F as one example, is thus fabricated as a result of the partial photoresist dry etching process. The result of the partial photoresist dry etching process shown in FIG. 6F is theoretically identical to the result of the conventional photoresist dry etching process shown in FIG. 1E, and to the result of the conventional photoresist-free dry etching process shown in FIG. 2D.

However, the inventive partial photoresist process avoids the disadvantages of the photoresist and photoresist-free processes, while maintaining their advantages. Specifically, the partial photoresist process maintains the proper profile shaping of the photoresist process, while avoiding the poor profile shaping of the photoresist-free process. Likewise, the partial photoresist process maintains the good critical dimension control of the photoresist-free process, while avoiding the proximity effect of the photoresist process that results in poor critical dimension control.

It is noted that, although specific embodiments have been illustrated and described herein, it will be appreciated by those of ordinary skill in the art that any arrangement is calculated to achieve the same purpose may be substituted for the specific embodiments shown. This application is intended to cover any adaptations or variations of the present invention. For example, whereas the invention has been substantially described in conjunction with a film including a hard mask, doped polysilicon, undoped polysilicon, and a stop layer, the invention can also be used in conjunction with films that contain other layers in addition to or in lieu of such layers. Therefore, it is manifestly intended that this invention be limited only by the claims and equivalents thereof.

What is claimed is:

1. A method comprising:
    etching a hard mask layer and a doped polysilicon layer below the hard mask layer of a film on a semiconductor wafer also including an undoped polysilicon layer below the doped polysilicon layer, using a photoresist mask above the hard mask layer to impart a pattern through the hard mask layer and the doped polysilicon layer;
    removing the photoresist mask from above the hard mask layer of the film on the semiconductor wafer; and,
    etching the undoped polysilicon layer of the film on the semiconductor wafer, using the hard mask to impart the pattern through the undoped polysilicon layer.

2. The method of claim 1, wherein etching the hard mask layer and the doped polysilicon layer using the photoresist mask comprises:
    adding photoresist on the film above the hard mask layer of the film;
    exposing the photoresist according to the pattern, such that at least one first part of the photoresist is exposed and at least one second part of the photoresist is unexposed; and,
    removing the at least one first part of the photoresist that was exposed such that only the at least one second part of the photoresist that was unexposed remains as the photoresist mask.

3. The method of claim 2, wherein adding the photoresist on the film comprises depositing the photoresist on the film above the hard mask layer of the film.

4. The method of claim 2, wherein the at least one first part of the photoresist is polymerized photoresist as a result of exposure, and the at least one second part of the photoresist remains unpolymerized photoresist, such that removing the at least one first part of the photoresist comprises developing the polymerized photoresist.

5. The method of claim 1, wherein etching the hard mask layer and the doped polysilicon layer using the photoresist mask comprises dry etching the hard mask layer and the doped polysilicon layer using the photoresist mask.

6. The method of claim 1, wherein removing the photoresist mask comprises stripping the photoresist mask from above the hard mask layer of the film.

7. The method of claim 1, wherein etching the undoped polysilicon layer using the hard mask comprises dry etching the undoped polysilicon layer using the hard mask.

8. The method of claim 1, wherein etching the undoped polysilicon layer using the hard mask comprises etching the undoped polysilicon layer through to a stop layer of the film below the undoped polysilicon layer.

9. A method comprising:
    photoresist dry etching of at least one but not all of a plurality of layers, including photoresist dry etching at least a first polysilicon layer, on a semiconductor wafer to impart a pattern through the at least one but not all of the plurality of layers;
    removing photoresist from the plurality of layers; and,
    photoresist-free dry etching of the plurality of layers remaining after the photoresist dry etching of the at least one but not all of the plurality of layers to impart the pattern through the plurality of layers remaining, including photoresist-free dry etching at least a second polysilicon layer under the first polysilicon layer.

10. The method of claim 9, wherein photoresist dry etching of the at least one but not all of the plurality of layers on a semiconductor wafer comprises:
    adding photoresist on the plurality of layers;
    exposing the photoresist according to the pattern; and,
    developing the photoresist after exposure.

11. The method of claim 9, wherein the plurality of layers includes at a hard mask layer, such that photoresist dry etching is performed through to and including the hard mask layer and the first polysilicon layer.

12. The method of claim 9, wherein photoresist dry etching comprises using a photoresist mask to impart the pattern through the at least one but not all of the plurality of layers.

13. The method of claim 9, wherein the plurality of layers includes a hard mask layer, such that photoresist-free dry etching uses the hard mask layer to impart the pattern through the second polysilicon layer.

14. The method of claim 9, wherein the plurality of layers includes a hard mask layer, the hard mask layer etched during photoresist dry etching, and photoresist-free dry etching uses the hard mask layer to impart the pattern through the second polysilicon layer.

* * * * *